Nov. 4, 1969 P. H. ROBINSON 3,476,617

ASSEMBLY HAVING ADJACENT REGIONS OF DIFFERENT SEMICONDUCTOR MATERIAL ON AN INSULATOR SUBSTRATE AND METHOD OF MANUFACTURE

Filed Sept. 8, 1966 3 Sheets-Sheet 1

INVENTOR
PAUL H. ROBINSON
BY
[signature]
ATTORNEY

Nov. 4, 1969 P. H. ROBINSON 3,476,617

ASSEMBLY HAVING ADJACENT REGIONS OF DIFFERENT SEMICONDUCTOR MATERIAL ON AN INSULATOR SUBSTRATE AND METHOD OF MANUFACTURE

Filed Sept. 8, 1966 3 Sheets-Sheet 2

INVENTOR
PAUL H. ROBINSON
BY
ATTORNEY

ASSEMBLY HAVING ADJACENT REGIONS OF DIFFERENT SEMICONDUCTOR MATERIAL ON AN INSULATOR SUBSTRATE AND METHOD OF MANUFACTURE

Filed Sept. 8, 1966 3 Sheets-Sheet 3

INVENTOR
PAUL H. ROBINSON
BY
[signature]
ATTORNEY 3,476,617

ASSEMBLY HAVING ADJACENT REGIONS OF DIFFERENT SEMICONDUCTOR MATERIAL ON AN INSULATOR SUBSTRATE AND METHOD OF MANUFACTURE

Paul Harvey Robinson, Trenton, N.J., assignor to RCA Corporation, a corporation of Delaware Filed Sept. 8, 1966, Ser. No. 577,917
Int. Cl. H01l 5/00, 7/32
U.S. Cl. 148—175 2 Claims

ABSTRACT OF THE DISCLOSURE

A method of providing contiguous adjacent regions of monocrystalline semiconductor material of different conductivity characteristics on a monocrystalline insulator substrate, comprising growing a first epitaxial layer of semiconductor material onto said insulator substrate, said first layer having a given conductivity characteristic, and said semiconductor material having substantially the same atomic spacing in its crystal lattice as said substrate, removing certain portions of said first layer to expose corresponding portions of said insulator substrate, growing a second layer of monocrystalline semiconductor material onto the remaining portions of said first layer and onto the exposed portions of said insulator substrate, said second layer having a conductivity characteristic different from that of said first layer, and removing the top portion of said second layer to a depth sufficient to expose the remaining portions of said first layer.

This invention relates to semiconductor structures having adjacent regions of different conductivity characteristics formed in a continuous thin stratum of semiconductor material grown on an insulator substrate and to an improved method of making such structures.

The term "different conductivity characteristics" as used herein is intended to encompass both differences in type of conductivity and differences in degree of conductivity of the same type.

Structures of this kind may be used, for example, in semiconductor integrated circuits wherein active devices particularly tailored to circuit design requirements are subsequently formed in the adjacent regions. Such structures may also be used, for example, in semiconductor integrated circuits wherein complementary transistors (e.g. NPN and PNP unipolar or bipolar transistors) are subsequently formed in the adjacent regions.

The demand for integrated circuits employing complementary pairs of unipolar transistors is constantly increasing. The complementary-pair unipolar transistor unit has found widespread acceptance as a storage device in computers for the following reasons: (1) unlike storage devices employing passive components, no power is required to maintain information stored in the complementary-pair transistors, (2) the complementary-pair transistors make possible a more compact assembly than is possible with passive components, and (3) the complementary-pair transistors have a much faster switching time than conventional passive component storage devices.

The semiconductor integrated circuit art currently uses various approaches for fabricating assemblies which include adjacent regions of semiconductor material of different conductivity characteristics. According to one general method, a single crystalline layer of semiconductor material having a given conductivity characteristic is formed by epitaxial growth techniques onto an insulator substrate. Regions of different conductivity characteristics are then formed within the layer by ordinary diffusion techniques. Because the diffusion process is slow, this method requires many hours for the manufacture of a single assembly. It is also difficult to control the impurity concentration profile of the diffused regions because the diffusion occurs in a lateral direction as well as in a downward direction.

Another method comprises starting with a monocrystalline semiconductor chip having one conductivity characteristic and forming a region of different conductivity characteristic, adjacent a surface of the chip, by diffusion techniques. This method has the same disadvantages as the first method with respect to the regions formed by diffusion.

One object of the invention is to provide an improved monocrystalline semiconductor body with adjacent regions of different conductivity characteristics wherein the impurity concentration of each region has improved uniformity.

Another object of the invention is to provide an improved monocrystalline semiconductor host material suitable for fabricating complementary pairs of transistors.

Briefly, the improved assembly comprises a monocrystalline insulator substrate, and a plurality of adjacent monocrystalline semiconductor regions on said substrate. The adjacent regions have different conductivity characteristics and the adjacent regions are grown regions on the substrate.

The improved method includes the steps of growing a first layer of monocrystalline semiconductor material having a given conductivity characteristic onto a monocrystalline insulator substrate, then removing certain portions of this layer to expose corresponding portions of the substrate. Next, a second layer of monocrystalline semiconductor material is grown over the remaining portions of the first layer and the exposed portions of the substrate. The second layer of semiconductor material has a conductivity characteristic different from that of the first layer. The top portion of the second layer is then removed to a depth sufficient to expose the remaining portions of the first layer. The resulting structure is an insulator substrate having a plurality of adjacent regions of different conductivity characteristic semiconductor material suitable for integrated circuit device fabrication.

In the drawings:

FIGURES 1(*a*)–1(*d*) are cut away perspective views of the improved assembly illustrating various stages of its fabrication according to the improved method.

Figure 1A:
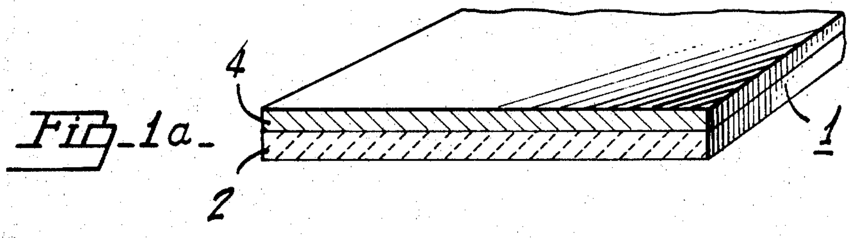
Figure 1B:
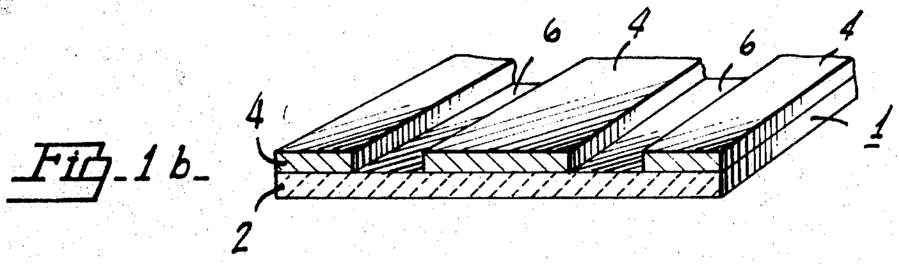
Figure 1C:
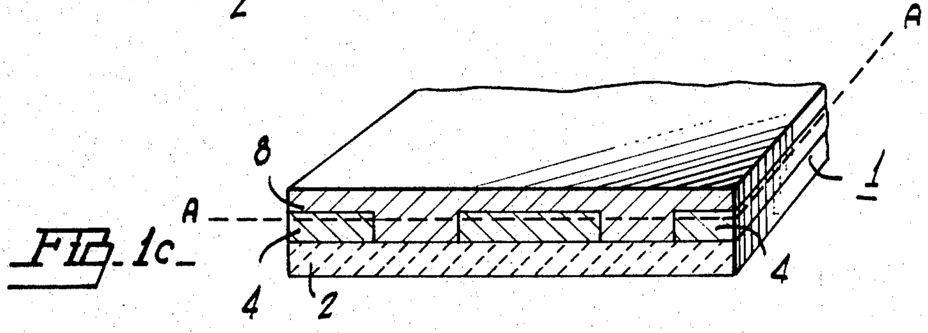
Figure 1D:
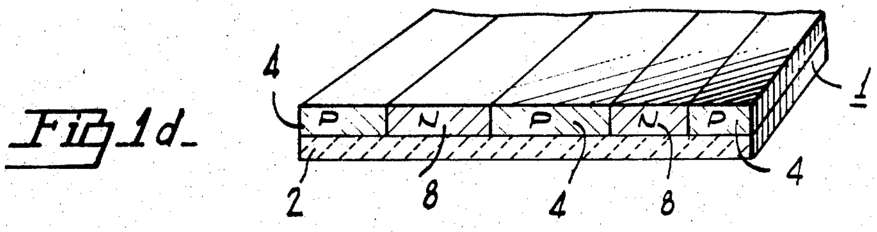

FIGURE 1*d* shows one form of an article in accordance with the invention. The article comprises a substrate 2 of a monocrystalline insulating material such as alumina or spinel. In the example later to be described, the material is alumina. On a surface of the insulator substrate 2 are monocrystalline regions 4 of N type semiconductor material alternating with monocrystalline regions 8 of P type semiconductor material.

The article, as shown in FIGURE 1*d*, may be prepared as follows:

Example

Illustrated in FIGURE 1*a* is an assembly 1 which comprises a monocrystalline insulator substrate 2 having a semiconductor layer 4 thereon. The semiconductor layer 4, in the preferred embodiment, is a monocrystalline silicon layer. Although various methods may be used to deposit the silicon layer 4 onto the substrate 2, the preferred method is described with reference to FIGURE 2.

Figure 2:
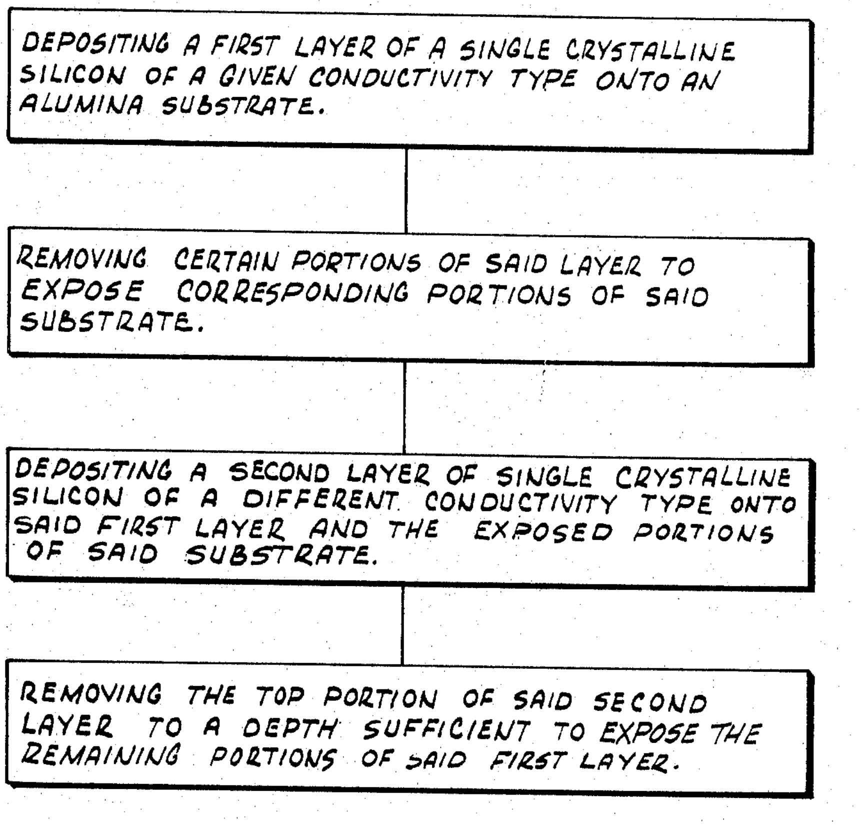
FIGURE 2 is a flow chart describing one embodiment of the improved method, particularly for forming adjacent semiconductor regions of different type conductivity on an insulator substrate.

In accordance with the method described in FIGURE 2, a body of monocrystalline alumina is prepared as an insulating substrate. Clear varieties of synthetic monocrystalline alumina are now commercially available, and are also known as sapphire and ruby. In this example, the substrate utilized is a body of water-white synthetic monocrystalline alumina, such as that sold commercially by Linde Company Crystal Products Division as "sapphire." The exact size and shape of the body are not critical. It has been found, however, that a silicon layer of improved monocrystalline quality is obtained when the deposition of the layer is carried out on a $1\bar{1}02$ crystal plane of the sapphire. Thus, it is preferred to employ a sapphire body which has been oriented, cut and lapped so as to expose a $1\bar{1}02$ plane on a major surface thereof. The sapphire body may conveniently be a disc about 0.020 inch thick and 0.375 inch in diameter.

While the exact mechanism for the improved result thus obtained is not certain, it is known that when sections of a hexagonal crystal are made in different ways, the spacing and density of the crystal atoms in the exposed crystal face will vary. By cutting and lapping a major face of the sapphire disc so that a $1\bar{1}02$ crystal face is exposed, the spacing of atoms in this exposed crystal face becomes close to the spacing of atoms in monocrystalline silicon. It is presently believed that this close match in lattice distance enables deposition of the best monocrystalline silicon layers.

The major face of the sapphire disc on which layer 4 is to be deposited is polished to a high degree of smoothness. A smooth surface is important since the silicon subsequently deposited undesirably tends to collect preferentially on any scratches or irregularities on the surface of the substrate.

After one face of the sapphire disc has been polished, the disc is degreased by cleaning it with ultrasonic energy in an organic solvent such as chloroform or the like.

Figure 3:
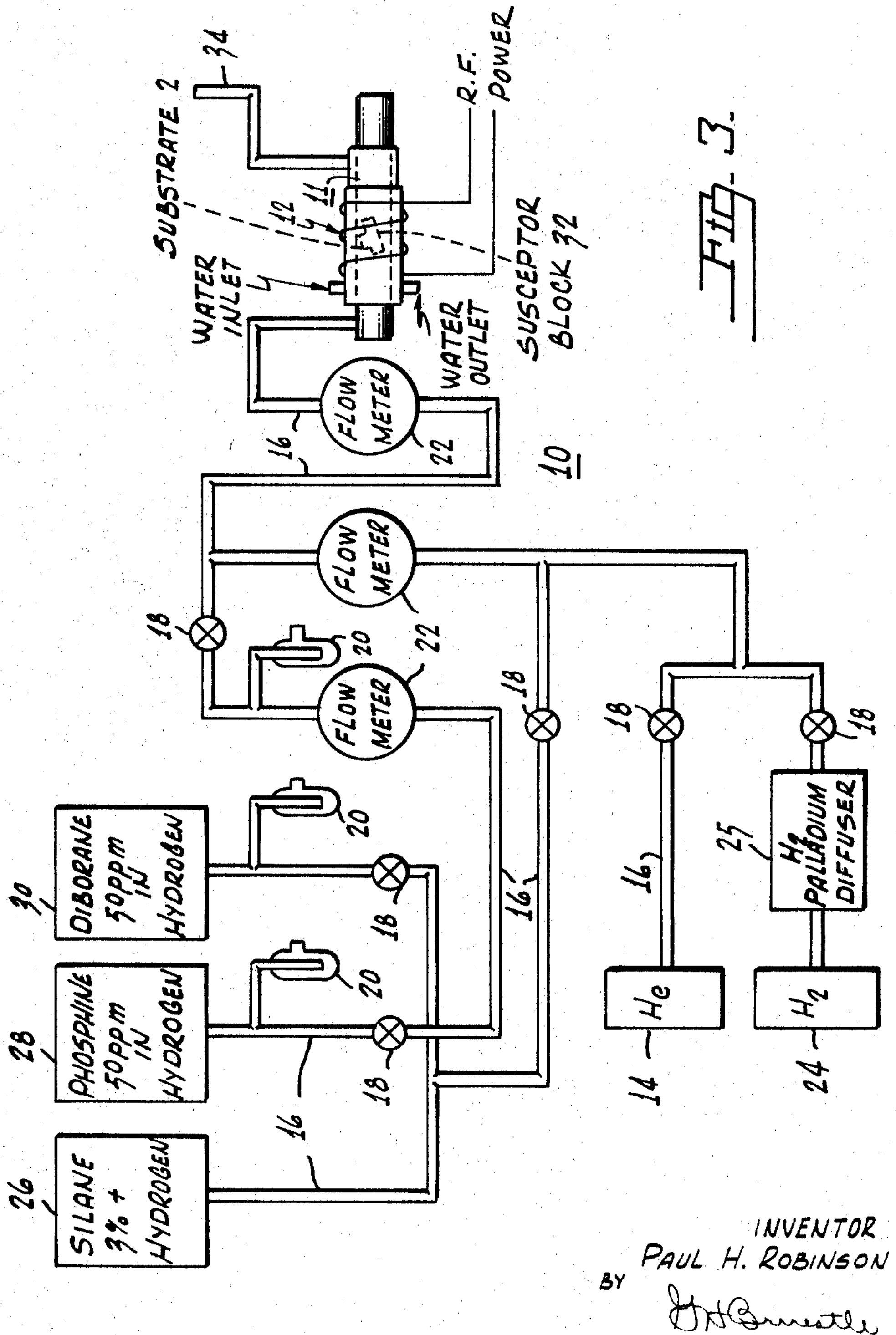
FIGURE 3 is a schematic diagram of apparatus useful in the practice of the method of FIGURE 2.

Following preparation of the sapphire disc as described above, apparatus 10, as illustrated in FIGURE 3, may be used in the further processing thereof.

Apparatus 10 comprises a water-cooled quartz furnace tube 11 provided with an RF heating coil 12. A helium tank 14 is connected to the furnace tube 11 by a system of quartz pipes 16 suitably equipped with valves 18, liquid traps 20, and flow meters 22. A hydrogen source 24 is similarly connected to furnace tube 11. Before reaching the furnace tube, the hydrogen is purified by passing it through a palladium diffuser 25.

Gas tanks 26, 28, and 30 are also connected to the furnace tube 11 by the quartz pipes 16. The gas tank 26 contains a mixture of hydrogen and about 1 to 5 volume percent silane. In this example, the tank 26 contains a mixture of 97 volume percent hydrogen and 3 volume percent silane. The tank 28 contains a mixture of hydrogen and a gas which induces N type conductivity in silicon. In this example, the tank 28 contains hydrogen with about 50 parts per million phosphine. The tank 30 contains a mixture of hydrogen and a gas which induces P type conductivity in silicon. In this example, the tank 30 contains hydrogen with about 50 parts per million diborane.

The polished sapphire substrate 2 (FIGURE 3) is positioned in the water-cooled furnace tube 11 on a silicon susceptor block 32 with the polished face of the substrate 2 uppermost. The apparatus 10 is flushed first with helium from tank 14, then with hydrogen from tank 24. The substrate 2 is next heated in an ambient of flowing hydrogen for about 15 minutes at about 1250° C. This step effectively cleans the surface of the sapphire substrate. The substrate 2 is then cooled to about 1150° C. while maintaining the flow of hydrogen. Block 32 is kept at about 1000° C. to 1150° C.

The silane-hydrogen mixture from tank 26 is now passed into furnace tube 11. Pure silane tends to decompose with explosive violence when exposed to oxygen, but silane diluted with hydrogen decomposes smoothly to form hydrogen and elemental silicon. The hydrogen passes out of furnace tube 11 through the gas exit 34, while some of the silicon deposits on the polished face of sapphire substrate 2 as the monocrystalline layer 4 (FIGURE 1). The rate of deposition of the silicon layer varies with: (1) the concentration of silane in the mixture, (2) the rate of flow of the mixture, and (3) the temperature in the furnace.

After the monocrystalline silicon layer or structure 4 (FIGURE 1) has attained the desired thickness, which may, in the preferred embodiment, be in the range of about 1 to 50 microns, the flow of the silane-hydrogen mixture from tank 26 is terminated. Then, without removing the substrate 2 from the furnace tube 11, it is heated to a temperature of about 1335° to 1400° C. in an ambient which does not react with the silicon. For example, an ambient of hydrogen or an inert gas may be used. This temperature is maintained for about 60 minutes. Care must be taken not to exceed 1425° C., the melting point of the monocrystalline silicon layer 4. It has been found that the thermal energy imparted to the substrate by this last step causes atoms in the monocrystalline silicon layer to rearrange themselves to form a more perfect crystalline structure. Photomicrographs of the crystal structure have revealed that the number of imperfections decreases significantly. While the improved crystalline structure begins to occur when the annealing process takes place at a temperature about 1250° C., the preferred temperature is about 1335° C. to 1400° C. The sapphire substrate 2 is then cooled to room temperature in the hydrogen or an inert ambient. For best results, a cooling rate of about 25° C. per minute is preferred.

The silicon layer 4 (FIGURE 1) formed as described above is uniformly of P type conductivity. This is brought about by aluminum from the substrate being incorporated into the silicon layer during its growth. Apparently the aluminum gets into the silicon layer both by vaporizing and by diffusion and becomes substantially uniformly distributed. However, if it is desired to deposit a P type monocrystalline silicon layer with lower resistivity than that provided in the above example, the method described above may be followed with the addition of an acceptor. When the silane-hydrogen mixture from tank 26 is flowing into the furnace tube 11, the valve on tank 30 is opened so that some of the diborane-hydrogen mixture also enters furnace tube 11. As a result, the silicon layer deposited on the sapphire substrate contains some boron atoms, thereby increasing the concentration of holes (positive charge carriers) in the silicon layer, and decreasing the electrical resistivity of the layer. The level of boron doping in the silicon layer may be varied as desired by monitoring the amount of diborane-hydrogen mixture flowing into the furnace tube 11.

If desired, N type monocrystalline silicon layers may be deposited instead of P type layers. The method described is generally suitable for this purpose, with one change. When the silane-hydrogen mixture from tank 26 is flowing into the furnace tube 11, the valve on tank 28 is opened, so that some of the phosphine-hydrogen mixture also enters the furnace tube 11. The silicon layer thus deposited on the sapphire substrate contains sufficient phosphorus atoms to be of N type conductivity. The concentration of phosphorus atoms in the silicon layer, hence the negative charge carrier (electron) concentration, and the electrical resistivity of the layer, may be varied as desired by controlling the amount of the phosphine-hydrogen mixture which is passed into the furnace tube 11.

After the silicon layer 4 has been deposited on the alumina substrate in the manner described above, certain portions of the layer 4 are removed to exposed corresponding portions 6 of the substrate 2 as illustrated in FIGURE 1*b*. Etching, sawing, ultrasonic cutting or any other suitable method may be used to remove the undesired portions of layer 4. In the preferred embodiment, conventional photoresist and etching techniques are used to remove the undesired portions of layer 4. First, a layer of silicon oxide is formed on the silicon as by thermal growth in wet steam. The oxide layer provides better adherence for the photoresist. Next, a photoresist coating is deposited onto the oxide film. The resist coating is then exposed to a pattern of light thereby rendering the exposed areas insoluble to a solvent in which the unexposed resist will dissolve. The unexposed portion of the photoresist coating represents the unwanted portion of layer 4. The entire surface of the photoresist coating is then washed with a solvent, for example, a commercial stripper sold by Indus-Ri-Chem Laboratories and known as J–100. The exposed portions of the photoresist coating are insoluble to the solvent J–100, whereas the unexposed portions of the photoresist coating are dissolved to reveal the oxide which is grown over the silicon layer. To remove the exposed oxide, hydrofluoric acid (HF) is used. The hydrofluoric acid does not dissolve either the photoresist coating or the silicon semiconductor layer 4. Next, a 10% by volume solution of potassium hydroxide and water is used to remove the unwanted silicon semiconductor layer 4, thereby leaving the exposed portions 6 on the substrate 2. The temperature of the solution is preferably 50° C.–90° C.

The exposed photoresist layer is removed by the use of a solution consisting of chromic acid and sulfuric acid. This solution reacts only with the exposed photoresist layer. Finally, the remaining oxide, which was beneath the exposed photoresist layer, is removed by the use of hydrofluoric acid (HF). The resulting structure is illustrated in FIGURE 1*b*.

As illustrated in FIGURE 1*c*, a layer 8 of semiconductor material is grown over the remaining portions of the layer 4 and the exposed portions 6 of substrate 2. The layer 8 may be of a different conductivity type than layer 4. Since layer 4 is described as a P type semiconductor layer, the layer 8 may be an N type semiconductor layer. The layer 8 is grown in the manner previously described, and the resulting structure is shown in FIGURE 1*c*.

Next, the upper portion of assembly 1 of FIGURE 1*c* is removed to a depth as shown by the dotted line A—A. Etching, polishing, sawing, ultrasonic cutting or any other suitable method may be used to remove the upper portion of assembly 1. In one embodiment, the assembly 1 is polished to remove the upper portion thereof. A polishing material sold by the Linde Company Crystal Products Division and known commercially as Lustrox may be used. The Lustrox is placed on a conventional polishing wheel, which is then applied to assembly 1 for a time sufficient to expose the remaining portions of layer 4. The amount of polishing required will vary depending on the thicknesses of the layers 4 and 8. The end product is illustrated in FIGURE 1*d*.

The article which is thus provided has certain unique and desirable characteristics. It provides a containuous thin structure of monocrystalline semiconductor material having contiguous regions of different conductivity characteristics each of which may have a substantially uniform concentration of doping impurity or impurities. Since the regions are uniformly doped in a controlled manner they are especially suitable for having devices such is bipolar transistors fabricated therein. And since there may be adjacent regions of opposite conductivity types, both P-N-P and N-P-N transistors can be fabricated side-by-side with a minimum of separate operations.

What is claimed is:

1. A method of providing contiguous adjacent regions of monocrystalline semiconductor material of different conductivity characteristics on a monocrystalline substrate of alumina or spinel, comprising:

(a) growing a first epitaxial layer of semiconductor material onto said substrate, said first layer having a given conductivity characteristic, and said semiconductor material having substantially the same atomic spacing in its crystal lattice as said substrate, (b) removing certain portions of said first layer to expose corresponding portions of said substrate, (c) growing a second layer of monocrystalline semiconductor material onto the remaining portions of said first layer and onto the exposed portions of said substrate, said second layer having a conductivity characteristic different from that of said first layer, and (d) removing the top portion of said second layer to a depth sufficient to expose the remaining portions of said first layer.

2. A method of providing adjacent N type and P type monocrystalline semiconductor silicon on a monocrystalline alumina substrate, comprising:

(a) epitaxially growing a first layer of single crystalline silicon onto a monocrystalline alumina substrate, said first layer having a given type conductivity, (b) removing certain portions of said first layer to expose corresponding portions of said substrate, (c) epitaxially growing a second layer of single crystalline silicon onto the remaining portions of said first layer and the exposed portions of said substrate, said second layer being of opposite type conductivity to said first layer, and (d) removing the top portion of said second layer to a depth sufficient to expose the remaining portions of said first layer, thereby providing adjacent regions of opposite type conductivity.

References Cited

UNITED STATES PATENTS

| | | | |
|---|---|---|---|
| 3,150,299 | 9/1964 | Noyce | 148—1.5 XR |
| 3,243,323 | 3/1966 | Corrigan et al. | 156—17 XR |
| 3,316,128 | 4/1967 | Osafune et al. | 148—1.5 XR |
| 3,320,485 | 5/1967 | Buie | 317—101 |
| 3,322,581 | 5/1967 | Hendrickson et al. | 148—175 |
| 3,390,022 | 6/1968 | Fa | 148—175 |
| 3,392,056 | 7/1968 | Maskalick | 117—106 XR |

L. DEWAYNE RUTLEDGE, Primary Examiner

P. WEINSTEIN, Assistant Examiner

U.S. Cl. X.R.

29—577, 580; 117—106, 201, 212; 148—1.5; 156—17; 317—101, 234, 235